United States Patent
Liu et al.

(10) Patent No.: US 9,591,275 B2
(45) Date of Patent: Mar. 7, 2017

(54) HYBRID CAMERA SENSOR FOR NIGHT VISION AND DAY COLOR VISION

(75) Inventors: Xinqiao Liu, Mountain View, CA (US); Feng Xiao, Libertyville, IL (US); Boyd Fowler, Sunnyvale, CA (US)

(73) Assignee: BAE Systems Imaging Solutions Inc., San Jose, CA (US)

(*) Notice: Subject to any disclaimer, the term of this patent is extended or adjusted under 35 U.S.C. 154(b) by 1564 days.

(21) Appl. No.: 12/892,467

(22) Filed: Sep. 28, 2010

(65) Prior Publication Data

US 2012/0075514 A1  Mar. 29, 2012

(51) Int. Cl.
H04N 5/335 (2011.01)
H04N 9/04 (2006.01)
H01L 27/146 (2006.01)

(52) U.S. Cl.
CPC ......... H04N 9/045 (2013.01); H01L 27/1461 (2013.01)

(58) Field of Classification Search
CPC .................................................. H04N 9/045
USPC ........................................ 348/294, 308, 374
See application file for complete search history.

(56) References Cited

U.S. PATENT DOCUMENTS

| | | | |
|---|---|---|---|
| 6,661,457 B1 | 12/2003 | Mathur et al. | |
| 7,518,645 B2 | 4/2009 | Farrier | |
| 2002/0035330 A1* | 3/2002 | Cline et al. | 600/476 |
| 2005/0140786 A1* | 6/2005 | Kaplinsky | 348/207.1 |
| 2006/0274171 A1* | 12/2006 | Wang | 348/294 |
| 2007/0045517 A1* | 3/2007 | Fukuyoshi et al. | 250/208.1 |
| 2007/0153104 A1 | 7/2007 | Ellis-Monaghan et al. | |
| 2007/0285547 A1 | 12/2007 | Milligan et al. | |
| 2010/0012841 A1* | 1/2010 | Rafferty et al. | 250/332 |

OTHER PUBLICATIONS

International Search Report, PCT/US2011/053324 dated Apr. 10, 2012.

* cited by examiner

*Primary Examiner* — Usman Khan
(74) *Attorney, Agent, or Firm* — Calvin B. Ward

(57) ABSTRACT

A hybrid imaging array and method for using the same is disclosed. The image array includes a low-light imaging array and a color imaging array. The two imaging arrays can be utilized separately or in conjunction with one another. The low-light imaging array is optimized for night vision or situations in which the light levels are too low to allow a conventional color image to be formed by the color imaging array. The color imaging array is optimized for daylight or color photography. The low-light imaging array can be utilized in conjunction with the color imaging array to provide a color image with reduced noise.

14 Claims, 3 Drawing Sheets

HYBRID CAMERA SENSOR FOR NIGHT VISION AND DAY COLOR VISION

BACKGROUND OF THE INVENTION

CMOS imaging arrays are utilized in numerous digital cameras. The imaging arrays are constructed from arrays of pixel cells in which each cell typically includes a photodiode and amplification circuitry for converting the photons accumulated during an exposure to a voltage signal that is then digitized to generate a picture.

The imaging arrays utilized in cameras that are designed for daytime photography differ significantly from imaging arrays that are designed for night or low-light photography, and hence, two different cameras must often be purchased and installed if images from both day and night are to be recorded. For daytime applications, the imaging arrays typically are constructed from pixels that have selective color sensitivities and block infrared wavelengths. For example, one commonly used design has clusters of pixels, one red, one blue, and two green sensitive pixels and an infrared filter that removes long wavelength radiation from the image before the photons reach the imaging array. Each pixel is constructed from a photodiode that is covered by a pigment filter that provides the different color sensitivity. The pixels in the green region of the spectrum have the highest sensitivity and are utilized for computing the overall light intensity as well as the intensity of light in the green region of the spectrum. For reasons related to the subsequent compression of the image, each cluster utilizes two green pixels.

Night imaging arrays typically use only one type of pixel and lack the infrared blocking filter. Since the number of photons that are available at each pixel is limited, the night cameras typically use larger pixels and lack wavelength filters that would further reduce the number of photons available at each pixel. The illumination that is available at night is typically shifted to the long wavelengths, and hence, the color rendering index of the illumination source is poor. Accordingly, providing color sensitive pixels is of significantly less value in night cameras.

Both types of cameras suffer from limited dynamic ranges. In general, each pixel has a range of light exposures that the pixel can measure. At low light exposures, noise dominates the measurement. At high light exposures, the pixel saturates, and hence, the output signal is no longer related to the light level. The dynamic range of typical commercial cameras is typically of the order of a 1000. That is, the exposure at which the pixel saturates is 1000 times the minimum exposure at which the pixel can detect an exposure over the noise levels.

If a scene does not include regions that differ in intensity by more than the dynamic range available from the imaging array, a satisfactory image can usually be recorded by selecting the correct overall exposure for the image. The exposure is set by adjusting the lens aperture and the exposure time. Cameras typically sample the scene to determine the best exposure. If the required dynamic range is greater than that available from the imaging array, or if the wrong sample points are chosen, this strategy fails, and at least part of the image will be under exposed or over exposed.

Even in cases in which the range of intensity values in the scene fits into the dynamic range of the camera, exposure problems can still be significant. Consider an image in which the exposure is set so that the bright portions of the image generate digital values that are near the maximum count of the analog-to-digital converter used to digitize the output of the photodiodes. Assume that this count is 1000. The error introduced by the digitization is ±½ count of the analog-to-digital converter, since all signals are rounded to the nearest count. This error is equivalent to introducing noise having a magnitude of ±½ count into the picture, and hence, will be referred to as the digitization noise in the following discussion. Consider two pixels, one having an exposure that produces a digital value of 500 and the other having an exposure that produces a digital value of 5. The later has a digitization noise of 10%, which is detectable by the human eye, while the former has digitization noise of 0.1%, which is not detectable by the eye. Hence, the low light portions of the image present problems even in the case in which the entire scene fits within the dynamic range of the camera.

In principle, the exposure problem can be improved by increasing the dynamic range of the pixels. However, this solution substantially increases the cost of the imaging array. To reduce the digitization noise, analog-to-digital converters that have significantly higher counts are needed, which increases the cost of the cameras.

SUMMARY OF THE INVENTION

The present invention includes a hybrid imaging array and method for using the same. The image array includes a low light imaging array and a color imaging array. The two imaging arrays can be utilized separately or in conjunction with one another. The low-light imaging array is optimized for night vision or situations in which the light levels are too low to allow a conventional color image to be formed by the color imaging array. The color imaging array is optimized for daylight or color photography. The low-light imaging array can be utilized in conjunction with the color imaging array to provide a color image with reduced noise.

DETAILED DESCRIPTION OF THE PREFERRED EMBODIMENTS OF THE INVENTION

Figure 1:
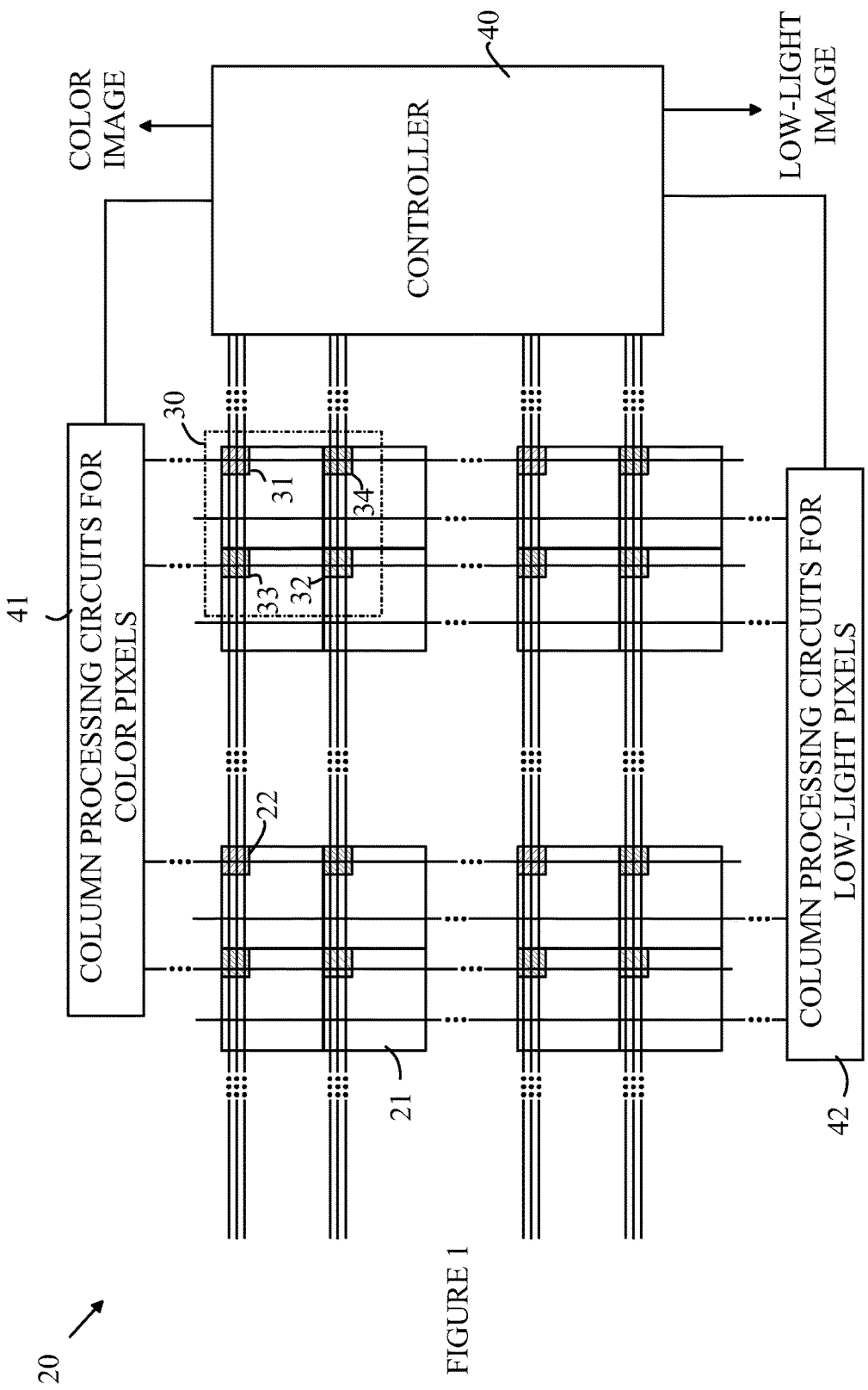
FIG. 1 is a simplified top view of a portion of an imaging according to one embodiment of the present invention.

The manner in which the present invention provides its advantages can be more easily understood with reference to FIG. 1, which is a simplified top view of a portion of an imaging array according to one embodiment of the present invention. Imaging array 20 can be viewed as having two sets of pixels, one set optimized for daytime color photography and one set optimized for low light or nighttime photography. A typical low-light pixel is shown at 21, and a typical color light pixel is shown at 22.

The color pixels are grouped into groups of four pixels. A typical four-pixel grouping is shown at 30. Each group includes two pixels for detecting light in the green portion of the optical spectrum, one pixel for detecting light in the red portion of the optical spectrum, and one pixel for detecting light in the blue portion of the optical spectrum. Typical color pixels for green light are shown at 31 and 32. Typical color pixels for red and blue light are shown at 33 and 34, respectively. The color pixels also include infrared filters that are formed over each pixel for blocking long wavelength light. The structure of the color pixels will be discussed in more detail below.

In this embodiment, there is one low light pixel corresponding to each color pixel. The low-light pixels have an area that is much larger than that of the color pixels, and hence, provide a signal above the noise floor for significantly lower light levels. In one embodiment, the color pixels have dimensions of 2 to 3 microns and the low-light pixels have dimensions of 5 to 10 microns. In addition, the sensitivity of the low-light pixels per square micron of area is optionally increased at longer wavelengths relative to the color pixels by utilizing a deeper implant region as discussed below and by omitting the color and infrared filter discussed above. The low light pixel sensitivity can be further increased using higher gain amplifier in the column processing circuits in 42.

Figure 2:
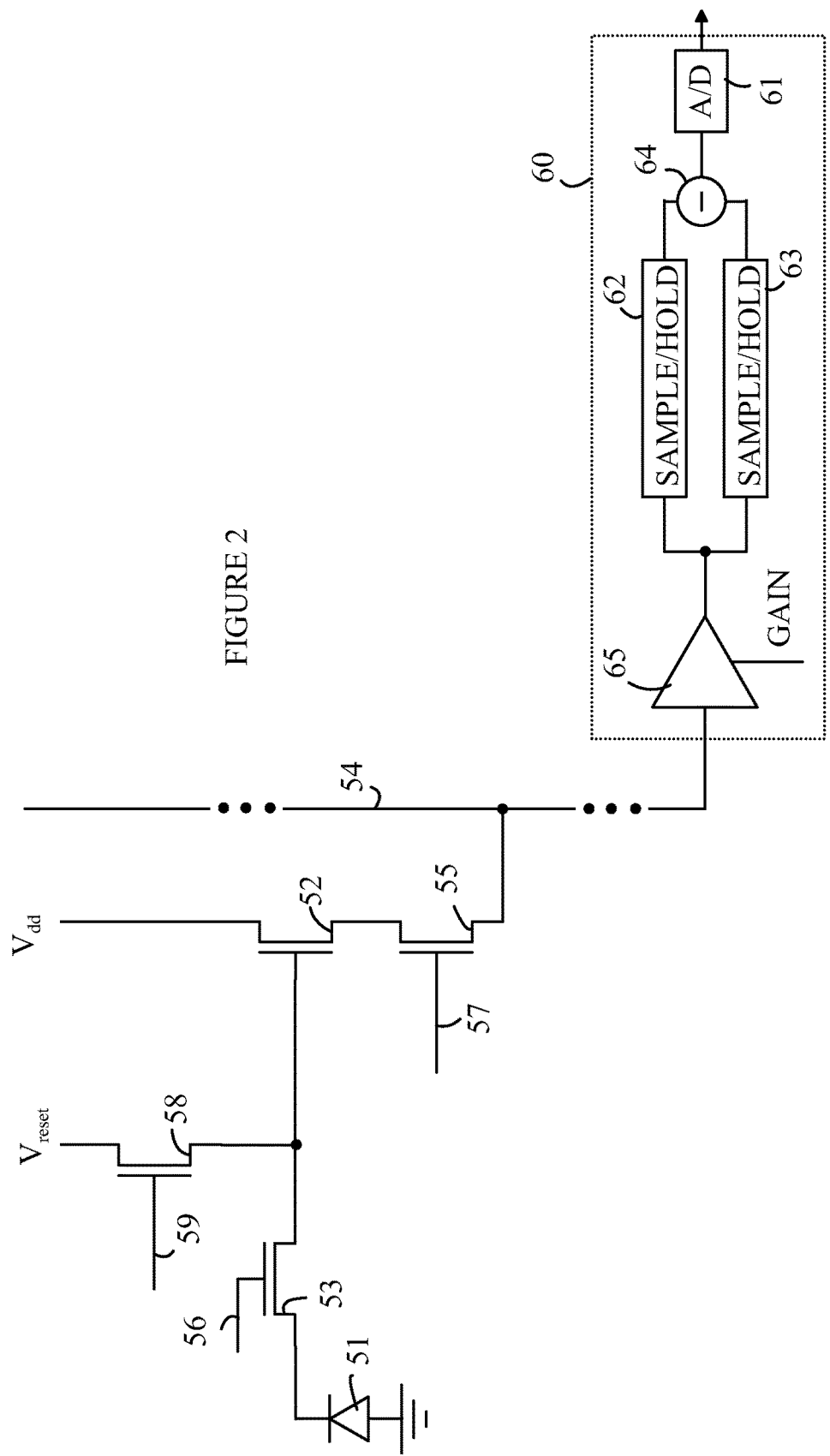
FIG. 2 is a schematic drawing of a typical pixel.

Both the color pixels and the low-light pixels include active circuitry in each pixel that amplifies the charge signal from the photodiodes in the pixels. The circuitry occupies part of the area shown for each pixel in FIG. 1; however, to simplify the drawing, the circuitry is not specifically shown in the area for each pixel. Refer now to FIG. 2, which is a schematic drawing of a typical pixel. Each pixel includes a photodiode 51 that is typically a pinned photodiode. Photodiode 51 is coupled to a source follower 52 by a gate 53. The output of source follower 52 is coupled to a bit line 54 by pixel select gate 55 in response to a signal on a row line 57.

As will be explained in more detail below, the charge accumulated on photodiode 51 during an exposure is transferred to source follower 52 via gate 53 that is controlled by a transfer gate signal on line 56. The potential on the gate of source follower 52 is reset prior to transferring charge by placing gate 58 in a conductive state. Gate 58 is controlled by signals on a reset line 59. Transfer line 56, reset line 59, and row line 57 are shared by all pixels in a given row.

From a circuit point of view, the low-light pixels differ from the color pixels in terms of the relative areas of the photodiodes in two types of pixels. In the embodiment shown in FIG. 1, each row of pixels includes alternating low-light and color pixels. The low-light and color pixels in each row share the same row line, transfer line, and reset line.

In this embodiment, the pixels are arranged in a rectangular array of pixels organized as a plurality of rows and columns. The columns alternate between low-light pixels and color pixels. All of the pixels in a given column are connected to a common bit line corresponding to that column. Unlike the row control lines, the bit lines are only connected to one type of pixel.

Each bit line terminates in a readout circuit 60 that includes an analog-to-digital converter 61 that converts the signal from the selected pixel to digital form. The analog-to-digital converter may include an amplification stage that amplifies the signal on the bit line prior to converting that signal. Readout circuit 60 also includes two sample and hold circuits shown at 62 and 63 and a circuit 64 that forms the difference of the two stored signals. The manner in which these circuit function will be explained in more detail below. In addition, readout circuit 60 can include a variable gain amplifier 65 that is controlled by the controller and whose use will be explained in more detail below.

The two sample and hold circuits are used to correct for reset noise. The charge that has been stored on photodiode 51 during an exposure is transferred to the gate of transistor 52. The parasitic capacitance of that gate converts the charge to a voltage which is output by transistor 52. Prior to transferring the charge from photodiode 51 to transistor 52, the gate of transistor 52 is resent to $V_{reset}$ by placing transistor 58 in a conductive state. Small fluctuations in the reset voltage can result in noise in the final pixel measurement, especially for measurements from pixels that received little light. To correct from such noise, the output of transistor 52 is sampled after the gate has been reset. The sampled value is stored on sample and hold circuit 63. The charge that is stored on photodiode 51 is then transferred to the gate of transistor 52 and the signal on bit line 54 is stored in sample and hold circuit 62. Analog-to-digital converter 61 operates on the difference of the two sample and hold signals, and hence, small variations in the reset voltage do not alter the final pixel output. This procedure will be referred to as "correlated double sampling" in the following discussion.

In one mode of operation, the two imaging arrays are operated independently of one another. The choice of imaging array is determined by the available light in this mode of operation. By utilizing a common set of two control lines, the cost and fraction of the imaging array that is blocked by the control lines is reduced. However, as will be explained in more detail below, the present invention can be operated in modes in which both imaging arrays are used together to provide enhanced performance.

Normally, an image is recorded based on an exposure time that is computed by sampling the image to be recorded at predetermined number of set points. The image is then recorded using this exposure time. If a region of the image is significantly brighter than the average intensity used to set the exposure time, the corresponding portion of the recorded image will be overexposed. That is, the intensity measured for the pixels in that region of the image will not be a linear function of the exposure experienced by the corresponding color pixels. Similarly, if a region of the image is significantly darker than the average intensity used to set the exposure time, that region will be under exposed.

In one mode of operation, the pixels are all reset just prior to the start of the exposure. The shutter is then opened for a period of time equal to the desired exposure time. At the end of the exposure, the shutter is closed, and the image is readout one row at a time using the double sampling technique described above. In this conventional mode, the gain of amplifier 65 remains fixed. Images based on the low-light pixels and the color pixels can be recorded simultaneously in this mode. However, the images must be started, and readout simultaneously if both images are to be readout, since the low-light and color pixels share the same row control lines, and hence, the low light pixel values will almost all be over exposed. Hence, in this mode, the imaging array that is best suited to the available light is used, and the other image array is ignored.

However, the present invention can be operated in a manner in which the low-light pixels provide information for color images that allows the color images to have a reduced noise. In such embodiments, the low-light pixels are used to estimate the intensity of light at each point in the image during a very brief exposure. The measured intensities are then used to adjust the range of the analog-to-digital converter that processes the signal from the corresponding color pixel when that pixel is readout such that the digitization noise is a smaller fraction of the intensity value. Since the low-light pixels have much greater sensitivity than the color pixels, the intensity can be acquired in a time that is short compared to the normal exposure time, and hence, the normal exposure time is not significantly lengthened.

For example, consider the case in which the maximum signal value that is to be processed is V, i.e., an analog-todigital converter value of 255 for an 8-bit converter. If the signal from a given pixel is likely to be 0.1 V, most of the range of the analog-to-digital converter will be wasted, and the digitization noise will be high, a few percent in this case. However, if an estimate of the signal is known in advance of processing the pixel signal, the gain of amplifier 65 can be increased to yield a signal that is closer to V, and hence, more of the bits of the analog-to-digital converter can be used. The final intensity reading is the output of the analog-to-digital converter and the amplification level used to preprocess the signals from the pixel. The signals from the low-light pixels provide the intensity estimates. Since the signal is only an estimate and does not take into account the effects of the color filter over the corresponding photodiode, the increase in amplification must take into account the uncertainty in the pixel intensity so that the resultant signal will not exceed V when the pixel is readout.

In one aspect of the present invention, a first short exposure is provided before the color pixels are reset and charge accumulation in the color pixels begins. Assume that the time to readout the low-light pixels small compared to the exposure time and that a color image is to be generated. In this case, an exposure can be recorded in two steps. After the shutter opens, all of the pixels are reset, and then read out after a very short exposure. Only the data from the low-light pixels is saved, since only these pixels will have significant charge stored given the very short exposure. The data is saved in a memory in controller 40 shown in FIG. 1 in this embodiment; however, the image could be saved in other locations.

After the low-light pixels have been read, all the pixels are again reset and the exposure is allowed to proceed to completion. It should be noted that the shutter time could be adjusted to account for the short exposure used to record the image using the low-light pixels. The first exposure time is chosen to be sufficient to provide an estimate of the light intensity at each pixel. At the end of the exposure, the color pixels are readout one row at a time as described above. However, the controller adjusts the gain of each amplifier 65 prior to processing the pixel that is currently connected to that amplifier. Controller 40 includes a table that maps the estimated intensities measured with the low-light pixels during the first exposure to amplification levels that are set for the amplifiers in each column. Pixels in which the low-light pixel estimate is low receive higher amplification levels than pixels in which the low-light pixel estimate is high. The actual amplification values are chosen to reduce the digitization noise while not resulting in an input signal to the analog-to-digital converter that exceeds the analog-to-digital converter's maximum input value. The amplification level together with the measured signal value for the analog-to-digital converter can then be used to compute the light intensity that was received by each pixel. The computed light intensity can then be outputted as a digital value having more bits than the output of the analog-to-digital converter.

In the second and third modes of operation, the shutter function is provided electrically without utilizing a mechanical shutter. In the second mode, each row of pixels is operated to record one line of the image while all of the other rows remain idle. This mode provides greater dynamic range for the image; however, this mode requires much longer total exposure times, and hence, is limited to scenes that are relatively static. In this mode, the low-light pixels are also used as local "exposure meters" to set an exposure for each color pixel in a row. In this mode, the start of an exposure is determined by the time at which the photodiodes are reset and the end is determined by the time the charge accumulated in the photodiode is transferred to the floating diffuse node that is connected to the base of the source follower.

In this mode, the estimate provided by the low-light pixels can be used to adjust the exposure time and/or the amplification level in the column that processes the signal from the color pixel. The estimate is again made by providing a first short exposure for the row in question, and reading out that exposure value using the low-light pixel column processing circuits. The color pixels are then reset and allowed to accumulate charge for an exposure time that is determined by the estimates for the row in question. At the end of the exposure, the pixels in the row are readout. The amplification value for each column amplifier is set according to the estimate of the expected pixel value in a manner analogous to that discussed above. It should be noted that the exposure time may differ from row to row in this embodiment, since the other rows of pixels are not active while the row in question is being used. Hence, the exposure time can be optimized for the row rather than for the entire image. This further improves the dynamic range of the camera.

As noted above, this second mode of operation is only practical if the exposure times for each row are small. The third mode of operation utilizes a shutter scheme in which all of the color pixels are accumulating charge while a selected row is being readout. In the third mode, each row is readout sequentially using the double sampling technique described above. At the end of the readout for a given row, the photodiodes are reset in that row and allowed to accumulate charge while the remaining rows are readout. The rows are readout cyclically. That is, after the last row has been readout, the first row is again readout. The timing of the readout is set such that the each row will be readout after a time equal to the exposure time has elapsed. This mode of operation is often used in movie cameras, as it produces a string of pictures separated in time by one exposure time and does not require a mechanical shutter.

In this third mode, a short exposure image measured with the low-light pixels is utilized to provide an estimate of the signal level that will be obtained from each of the color pixels. If a moving picture is being recorded, the short exposure can be interlaced with the other frames of the moving picture on a periodic basis to provide the estimates in question.

In the above-described embodiments, the low-light and color pixels share the same row control lines. However, embodiments in which each set of pixels has its own dedicated row control lines could also be constructed. Such an arrangement would allow each set of pixels to operate totally independently of the other set of pixels. For example, a short exposure on the low-light pixels could be readout while the color pixels are accumulating charge in a longer exposure.

The above-described embodiments utilize the low-light pixels in daytime color photography to improve the dynamic range of the color pixels. The color pixels can also be utilized during nighttime photography in some cases. If a low light scene has a small high intensity light source contained in the scene, the low-light pixels in that region of the screen will be saturated. In this case, the color pixels in that region of the scene can be utilized to provide a measure of the light intensity, since these pixels will often not be saturated. The degree to which this strategy can be utilized depends on the ratio of the light sensitivities of the low-light pixels and the color pixels. In some cases, the low-light pixels will saturate at light levels and exposures at which the color pixels are still receiving too little light to be useful.

As noted above, silicon photodiodes are sensitive in the infrared portion of the optical spectrum. The dyes used to construct the color filters over the color pixels do not block infrared radiation. Hence, absent an infrared blocking filter, the color pixels will measure the sum of the light intensity in the color band in question and the infrared radiation. An infrared blocking filter that covers both the color and low-light pixels, however, presents problems, since night and low-light imaging is improved by utilizing the long wavelength radiation. Hence, the present invention utilizes an infrared filter that covers only the color pixels.

Figure 3:
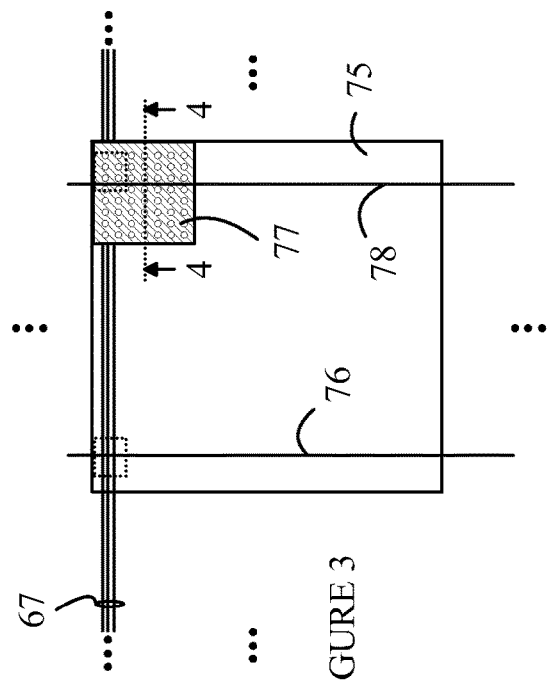
FIG. 3 is a top view of two pixels on the same row.
Figure 4:
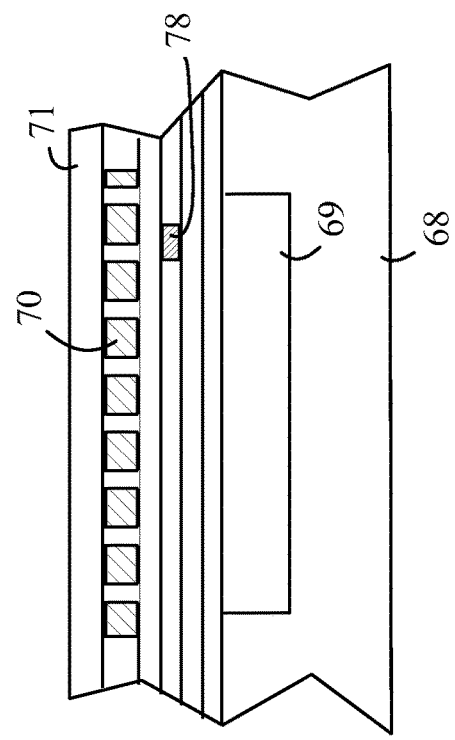
FIG. 4 is a cross-sectional view of the color pixel through line 4-4 shown in FIG. 3.

Refer now to FIGS. 3 and 4, which illustrate one embodiment of an imaging array according to the present invention that utilizes an infrared filter constructed from a metal layer in a conventional CMOS process. FIG. 3 is a top view of two pixels on the same row, and FIG. 4 is a cross-sectional view of the color pixel through line 4-4 shown in FIG. 3. The low-light pixel and color pixel are constructed from wells such as well 69 in a silicon substrate 68. Since such construction is routine in the art, the details of the fabrication of the photodiodes in silicon substrate will not be discussed here. As noted above, the low-light pixels can utilize a deeper well to increase the sensitivity of the pixels to long wavelength radiation in the infrared portion of the spectrum.

While the low-light and color pixels share the same row control lines, the two sets of pixels have different bit lines. The low-light pixel 75 is connected to bit line 76 that terminates on column processor 42 shown in FIG. 1. The corresponding color pixel 77 is connected to bit line 78 which terminates on column processor 41 shown in FIG. 1.

The row control lines 67 and the bit lines are fabricated in metal layers that overlie the silicon substrate and that are separated from one another by insulating layers. Bit line 78 is shown in one such layer in FIG. 4. The metal layers are typically formed from aluminum or copper layers.

In the present invention, a copper metal layer that is not used for the row and bit line conductors is patterned to form an infrared filter 70. The infrared filter is set to block light having a wavelength greater than 700 nm in one embodiment of the present invention. In another aspect of the invention, the low light pixels measure light in the 400 nm to 1100 nm range.

Light filters based on patterned metal layers are known to the art, and hence, will not be discussed in detail here. For the purposes of the present discussion, it is sufficient to note that the metal layers are patterned to have holes whose diameters are less than half of the wavelength of the light that is to be excluded and greater than half of the wavelength of the light that is to pass through the filter. In the case of a filter that is to block infrared while passing light in the visible region of the spectrum, the holes are typically 0.35 microns in diameter. If a good electrical conductor is utilized, the transmission of the layer to the desired light is greater than the ratio of the open space to the total surface area. This effect is attributed to the surface plasmon effect. Hence, the conduction must be sufficient to allow the surface plasmon effect to provide the increased conduction. Layers made from copper, silver, and gold have sufficient conductivity in this regard.

The above-described Summary of the Invention and embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An imaging array comprising:
a low-light imaging array comprising:
a plurality of rows and columns of low-light pixels; and
a low-light processor comprising a plurality of low-light bit lines, each low-light pixel in each column of low-light pixels being connected to one of said low-light bit lines corresponding to that column of low-light pixels; and
a color imaging array comprising:
a plurality of rows and columns of color pixels; and
a color processor comprising a plurality of color bit lines, each color pixel in each column of color pixels being connected to one of said color bit lines corresponding to that column of color pixels,
wherein each low-light pixel comprises a photodiode that is characterized by a first area and wherein each color pixel comprises a photodiode that is characterized by a second area, said second area being less than said first area, and wherein said color processor comprises a variable gain amplifier coupled to one of said color bit lines, said variable gain amplifier having a gain that is set in response to an estimate of charge stored in a pixel currently connected to that bit line.

2. The imaging array of claim 1 wherein there is one row of color pixels corresponding to each row of low-light pixels, and wherein said pixels on each row of low-light pixels and said corresponding row of color pixels are connected to a row bus that includes a row select line that causes each low-light pixel in that row to be connected to a corresponding one of said low-light bit lines and each color pixel in said corresponding color pixel row to be connected to a corresponding one of said color bit lines.

3. The imaging array of claim 1 wherein said estimate of charge is obtained from a light measurement in a corresponding low-light pixel.

4. The imaging array of claim 1 wherein at least one of said color pixels comprises a color filter that blocks light outside a predetermined portion of the optical spectrum from reaching said photodiode in that pixel.

5. The imaging array of claim 4 wherein said low-light pixels do not include a filter that blocks light within a frequency band from 400 nm to 1100 nm from entering said photodiodes in those pixels.

6. The imaging array of claim 4 wherein said color filter comprises an infrared filter that blocks light with wavelengths greater than 700 nm from reaching said photodiode in said color pixel.

7. An imaging array comprising:
a low-light imaging array comprising:
a plurality of rows and columns of low-light pixels; and
a low-light processor comprising a plurality of low-light bit lines, each low-light pixel in each column of low-light pixels being connected to one of said low-light bit lines corresponding to that column of low-light pixels; and
a color imaging array comprising:
a plurality of rows and columns of color pixels; and
a color processor comprising a plurality of color bit lines, each color pixel in each column of color pixels being connected to one of said color bit lines corresponding to that column of color pixels,
wherein each low-light pixel comprises a photodiode that is characterized by a first area and wherein each color pixel comprises a photodiode that is characterized by a second area, said second area being less than said first area, wherein at least one said color pixels comprises a color filter that blocks light outside a predetermined portion of the optical spectrum from reaching said photodiode in that pixel, wherein said color filter comprises an infrared filter that blocks light with wavelengths greater than 700 nm from reaching said photodiode in said color pixel, wherein said infrared filter comprises a layer of metal having holes therein, said layer of material overlying said photodiode in said color pixel.

8. The imaging array of claim 7 wherein said layer of metal comprises a layer of copper, silver, or gold.

9. The imaging array of claim 7 wherein said imaging array is constructed in a CMOS fabrication process and wherein said metal layer is one of a plurality of layers provided in that fabrication process for constructing electrical conductors for connecting components in said imaging array.

10. A method for forming an image of a scene, said method comprising forming an image of said scene on an imaging array comprising:
a low-light imaging array comprising:
a plurality of rows and columns of low-light pixels; and
a low-light processor comprising a plurality of low-light bit lines, each low-light pixel in each column of low-light pixels being connected to one of said low-light bit lines corresponding to that column of low-light pixels; and a color imaging array comprising:
a plurality of rows and columns of color pixels; and
a color processor comprising a plurality of color bit lines, each color pixel in each column of color pixels being connected to one of said color bit lines corresponding to that column of color pixels, wherein each low-light pixel comprises a photodiode that is characterized by a first area and wherein each color pixel comprises a photodiode that is characterized by a second area, said second area being less than said first area; and reading out said low-light imaging array or said color imaging array, and wherein said estimated image is used to set an exposure time for each row in said color imaging array, at least two of said rows having different exposure times.

11. The method of claim 10 comprising forming an estimated image with said low-light imaging array and using said estimated image to set parameters used in reading out said color imaging array.

12. The method of claim 11 wherein said color processor comprises a variable gain amplifier coupled to one of said color bit lines and wherein said estimated image is used to set a gain for said variable gain amplifier.

13. The method of claim 11 wherein said color image comprises a plurality of pixel signal values and corresponding variable gain amplifier values.

14. The method of claim 10 further comprising blocking light having a wavelength greater than 700 nm from reaching said color pixels while allowing that light to reach said low--light pixels.

* * * * *